(12) United States Patent
Kim et al.

(10) Patent No.: US 10,950,678 B2
(45) Date of Patent: Mar. 16, 2021

(54) THIN FILM TRANSISTOR SUBSTRATE AND ORGANIC LIGHT-EMITTING DISPLAY USING THE SAME

(71) Applicant: Samsung Display Co., Ltd., Yongin-si (KR)

(72) Inventors: Eunhyun Kim, Yongin-si (KR); Taeyoung Kim, Yongin-si (KR); Hyehyang Park, Yongin-si (KR); Shinhyuk Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/199,469

(22) Filed: Jun. 30, 2016

(65) Prior Publication Data

US 2017/0110528 A1    Apr. 20, 2017

(30) Foreign Application Priority Data

Oct. 16, 2015    (KR) ........................ 10-2015-0144738

(51) Int. Cl.
*H01L 27/32*     (2006.01)
*H01L 29/786*     (2006.01)
(Continued)

(52) U.S. Cl.
CPC ........ *H01L 27/3262* (2013.01); *H01L 27/124* (2013.01); *H01L 27/1225* (2013.01);
(Continued)

(58) Field of Classification Search
CPC ............. H01L 27/3262; H01L 27/1225; H01L 27/124; H01L 29/42384; H01L 29/78633;
(Continued)

(56) References Cited

U.S. PATENT DOCUMENTS 5,923,963 A  *  7/1999  Yamanaka ............ G02F 1/1362
                                                                                     257/E21.412
2003/0020065 A1*  1/2003  Honda ................ H01L 29/6675
                                                                                      257/67

(Continued)

FOREIGN PATENT DOCUMENTS

KR        2002-0046021 A     6/2002
KR    10-2006-0110143 A    10/2006
(Continued)

*Primary Examiner* — Dzung Tran
(74) *Attorney, Agent, or Firm* — H.C. Park & Associates, PLC

(57) ABSTRACT

A thin film transistor substrate that includes a substrate, a lower gate electrode arranged on the substrate, a semiconductor layer arranged on the substrate and overlapping the lower gate electrode, the semiconductor layer including a channel region interposed between a source region and a drain region, and an upper gate electrode arranged on the substrate and overlapping the semiconductor layer, the upper gate electrode being arranged on an opposite side of the semiconductor layer than the lower gate electrode, wherein at least one of the lower gate electrode and the upper gate electrode is perforated by an aperture to reduce a parasitic capacitance between the upper and lower gate electrodes.

7 Claims, 7 Drawing Sheets

(51) Int. Cl.
*H01L 27/12* (2006.01)
*H01L 29/423* (2006.01)

(52) U.S. Cl.
CPC .... *H01L 29/42384* (2013.01); *H01L 29/7869* (2013.01); *H01L 29/78633* (2013.01); *H01L 29/78648* (2013.01); *H01L 29/78696* (2013.01)

(58) Field of Classification Search
CPC ......... H01L 29/78648; H01L 29/78696; H01L 29/786
USPC ..................................... 257/40, 59; 345/212
See application file for complete search history.

(56) References Cited

U.S. PATENT DOCUMENTS

| | | | |
|---|---|---|---|
| 2003/0164500 A1* | 9/2003 | Tsunoda | H01L 27/1214 257/72 |
| 2007/0013823 A1* | 1/2007 | Jung | G02F 1/13318 349/42 |
| 2007/0145372 A1* | 6/2007 | Yamazaki | G02F 1/136227 257/66 |
| 2008/0079005 A1* | 4/2008 | Tseng | H01L 27/3272 257/72 |
| 2008/0090344 A1* | 4/2008 | Kuwabara | H01L 27/1214 438/166 |
| 2010/0006833 A1* | 1/2010 | Ha | H01L 29/7869 257/43 |
| 2010/0032679 A1* | 2/2010 | Kawae | H01L 27/1214 257/72 |
| 2011/0031491 A1* | 2/2011 | Yamazaki | G02F 1/136227 257/43 |
| 2014/0168194 A1 | 6/2014 | Kong et al. | |
| 2015/0014690 A1 | 1/2015 | Lv | |

FOREIGN PATENT DOCUMENTS

| | | |
|---|---|---|
| KR | 10-2014-0078419 A | 6/2014 |
| KR | 10-2014-0137729 A | 12/2014 |

* cited by examiner

FIG. 3A
FIG. 3B
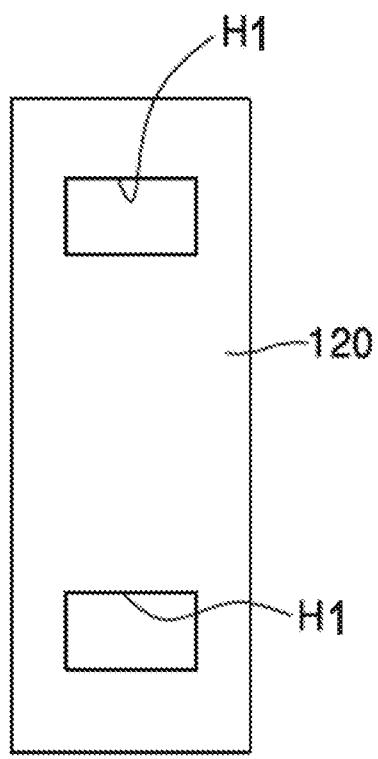
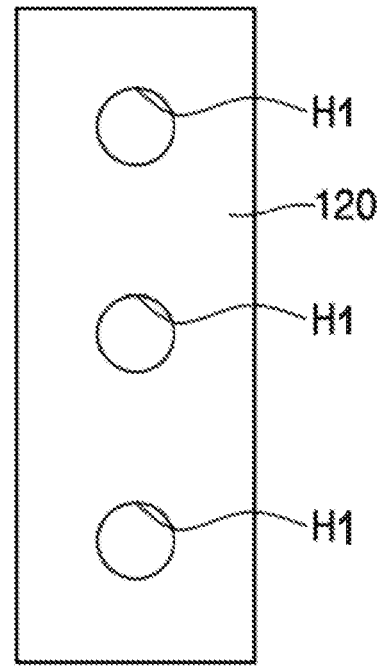

US 10,950,678 B2

THIN FILM TRANSISTOR SUBSTRATE AND ORGANIC LIGHT-EMITTING DISPLAY USING THE SAME

CLAIM OF PRIORITY

This application makes reference to, incorporates the same herein, and claims all benefits accruing under 35 U.S.C. § 119 from an application for THIN FILM TRANSISTOR SUBSTRATE AND ORGANIC LIGHT-EMITTING DISPLAY USING THE SAME earlier filed in the Korean Intellectual Property Office on Oct. 16, 2015 and there duly assigned Serial No. 10-2015-0144738.

BACKGROUND OF THE INVENTION

Field of the Invention

A double gate thin film transistor substrate having reduced parasitic capacitance between the two gate electrodes and an organic light-emitting display apparatus that includes the same.

Description of the Related Art

An organic light-emitting display apparatus includes two electrodes and an organic emission layer disposed between the two electrodes, and emits light as electrons injected from one electrode and holes injected from the other electrode combine in the organic emission layer to form excitons that emit energy.

Such an organic light-emitting display apparatus includes a plurality of pixels, each including an organic light-emitting diode that is a self-emission device, wherein a plurality of thin-film transistors and at least one capacitor for driving the organic light-emitting diode are also arranged in each of the pixels.

SUMMARY OF THE INVENTION

Such an organic light-emitting display apparatus includes a thin film transistor, and when a gate electrode of the thin film transistor has a double gate electrode structure, a parasitic capacitance is generated between an upper gate electrode and a lower gate electrode, and thus, picture quality degrades.

According to one aspect of the present invention, there is provided a thin film transistor substrate that includes a substrate, a lower gate electrode arranged on the substrate, a semiconductor layer arranged on the substrate and overlapping the lower gate electrode, the semiconductor layer including a channel region interposed between a source region and a drain region and an upper gate electrode arranged on the substrate and overlapping the semiconductor layer, the upper gate electrode being arranged on an opposite side of the semiconductor layer than the lower gate electrode, wherein at least one of the lower gate electrode and the upper gate electrode is perforated by a through hole.

The through hole may not overlap the semiconductor layer. The lower gate electrode may have a larger area when viewed from a top side than the upper gate electrode. An area of overlap between the lower gate electrode and the channel region may be greater than an area of overlap between the upper gate electrode and the channel region. The through hole may be filled with an insulating material. An electric potential of the lower gate electrode may be different from that of the upper gate electrode by being independently controlled.

The thin film transistor substrate may also include a gate control line arranged on the substrate and connected to the lower gate electrode and a threshold voltage compensation line arranged on the substrate and connected to the upper gate electrode. The thin film transistor substrate may also include a source electrode connected to the source region and a drain electrode connected to the drain region, wherein the upper gate electrode does not overlap any of the source and drain electrodes. The upper gate electrode may be perforated by a first through hole, and the lower gate electrode may be perforated by a second through hole, the first through hole and the second through hole may do not overlap each other. The semiconductor layer may include a material selected from indium gallium zinc oxide (IGZO), indium tin zinc oxide (ITZO), $SnO_2$, $In_2O_3$, ZnO, CdO, $Cd_2SnO_4$, and $TiO_2$, the lower gate electrode to prevent light transmitted through the substrate from reaching the semiconductor layer.

According to one aspect of the present invention, there is provided an organic light-emitting display apparatus that includes a plurality of pixels on a substrate, each of the pixels may include a switching thin film transistor arranged on the substrate, a driving thin film transistor arranged on the substrate and electrically connected to the switching thin film transistor, a pixel electrode connected to the driving thin film transistor, an emission layer arranged on the pixel electrode and an opposite electrode facing the pixel electrode, the emission layer being interposed between the pixel electrode and the opposite electrode, wherein the driving thin film transistor may include a lower gate electrode arranged on the substrate, a semiconductor layer arranged on the substrate and overlapping the lower gate electrode, the semiconductor layer including a channel region interposed between a source region and a drain region and an upper gate electrode arranged on the substrate and overlapping the semiconductor layer, the upper gate electrode being arranged on an opposite side of the semiconductor layer than the lower gate electrode, at least one of the lower gate electrode and the upper gate electrode may be perforated by a through hole.

The through hole may not be arranged at a location that corresponds to the semiconductor layer. The lower gate electrode may cover a larger area of the display apparatus than the upper gate electrode. An area of overlap area between the lower gate electrode and the channel region may be greater than an area of overlap between the upper gate electrode and the channel region. The through hole may be filled with an insulating material. A potential of the lower gate electrode differs from that of the upper gate electrode by being independently controlled.

The organic light-emitting display apparatus may also include a gate control line arranged on the substrate and connected to the lower gate electrode and a threshold voltage compensation line arranged on the substrate and connected to the upper gate electrode. The organic light-emitting display apparatus may also include a source electrode connected to the source region and a drain electrode connected to the drain region, wherein the upper gate electrode may not overlap any of the source and drain electrodes. The upper gate electrode may be perforated by a first through hole, and the lower gate electrode may be perforated by a second through hole, wherein the first through hole and the second through hole may not overlap each other. The semiconductor layer may include an oxide material having an element selected from a group including indium (In), gallium (Ga), tin (Sn), zirconium (Zr), vanadium (V), hafnium (Hf) cadmium (Cd), germanium (Ge), and zinc (Zn), the lower gate electrode may prevent light transmitted through the substrate from reaching the semiconductor layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 3A is a plan view of an upper gate electrode of a thin film transistor substrate according to another exemplary embodiment;

FIG. 3B is a plan view of an upper gate electrode of a thin film transistor substrate according to yet another exemplary embodiment;

DETAILED DESCRIPTION OF THE INVENTION

Figure 1:
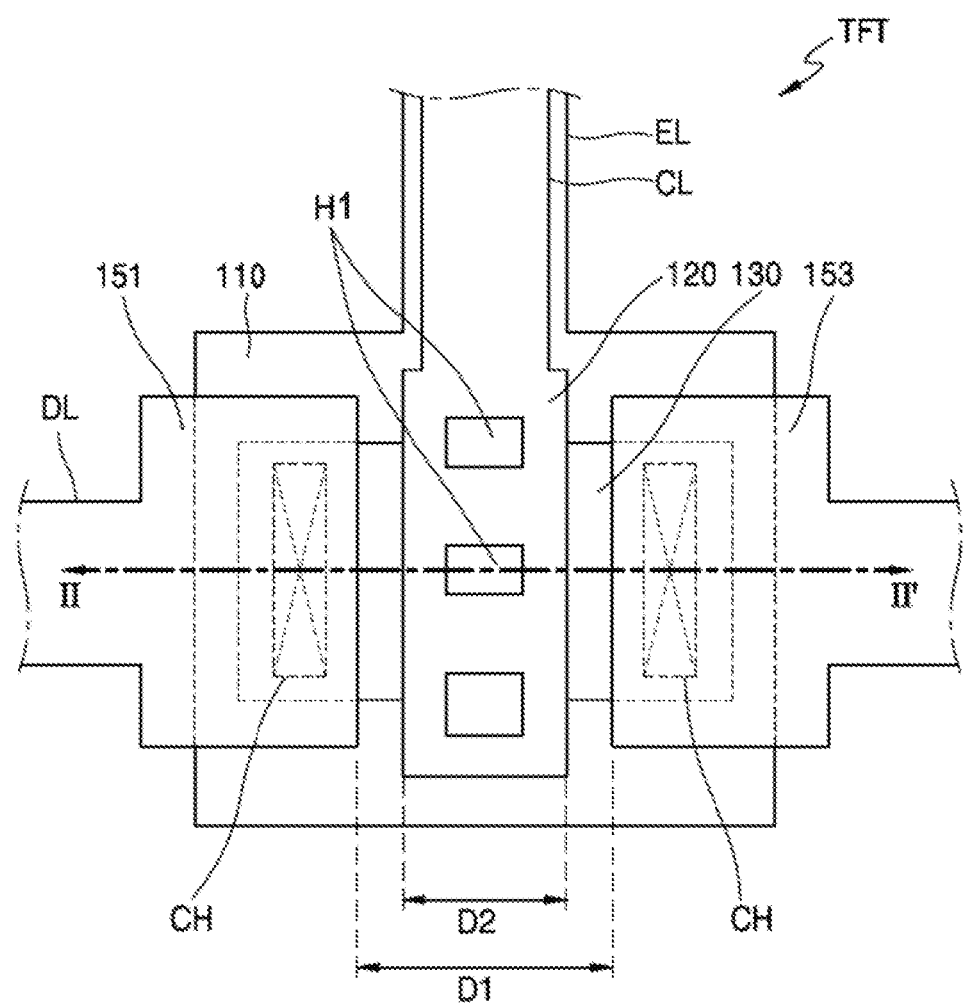
FIG. 1 is a schematic plan view of a thin film transistor substrate according to an exemplary embodiment.

As the inventive concept allows for various changes and numerous embodiments, exemplary embodiments will be illustrated in the drawings and described in detail in the written description. Advantages and features of one or more exemplary embodiments and methods of accomplishing the same may be understood more readily by reference to the following detailed description of the one or more exemplary embodiments and the accompanying drawings. The inventive concept may, however, be embodied in many different forms and should not be construed as being limited to the one or more exemplary embodiments set forth herein.

Reference will now be made in detail to exemplary embodiments, examples of which are illustrated in the accompanying drawings. Like reference numerals in the drawings denote like elements, and a repeated description thereof will be omitted.

While such terms as "first" and "second" may be used to describe various components, such components must not be limited to the above terms. The above terms are used only to distinguish one component from another.

The singular forms "a," "an," and "the" used herein are intended to include the plural forms as well, unless the context clearly indicates otherwise.

It will be understood that the terms such as "include," "comprise," and "have" used herein specify the presence of stated features or components, but do not preclude the presence or addition of one or more other features or components.

It will be further understood that when a layer, region, or component is referred to as being "on" another layer, region, or component, it can be directly or indirectly on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, exemplary embodiments are not limited thereto.

When an embodiment may be implemented differently, a specific process order may be performed differently from the described order. For example, two consecutively described processes may be performed substantially at the same time or performed in an order opposite to the described order.

When layers, regions, or components are "connected", the layers, region, or components may not only be "directly connected", but may also be "indirectly connected" via another layer, region, or component. For example, in the present specification, when layers, regions, or components are electrically connected, the layers, regions, or components may not only be directly electrically connected, but may also be indirectly electrically connected via another layer, region, or component.

The term "and/or" used herein includes any and all combinations of one or more of the associated listed items. Expressions such as "at least one of," when preceding a list of elements, modify the entire list of elements and do not modify the individual elements of the list.

Figure 2:
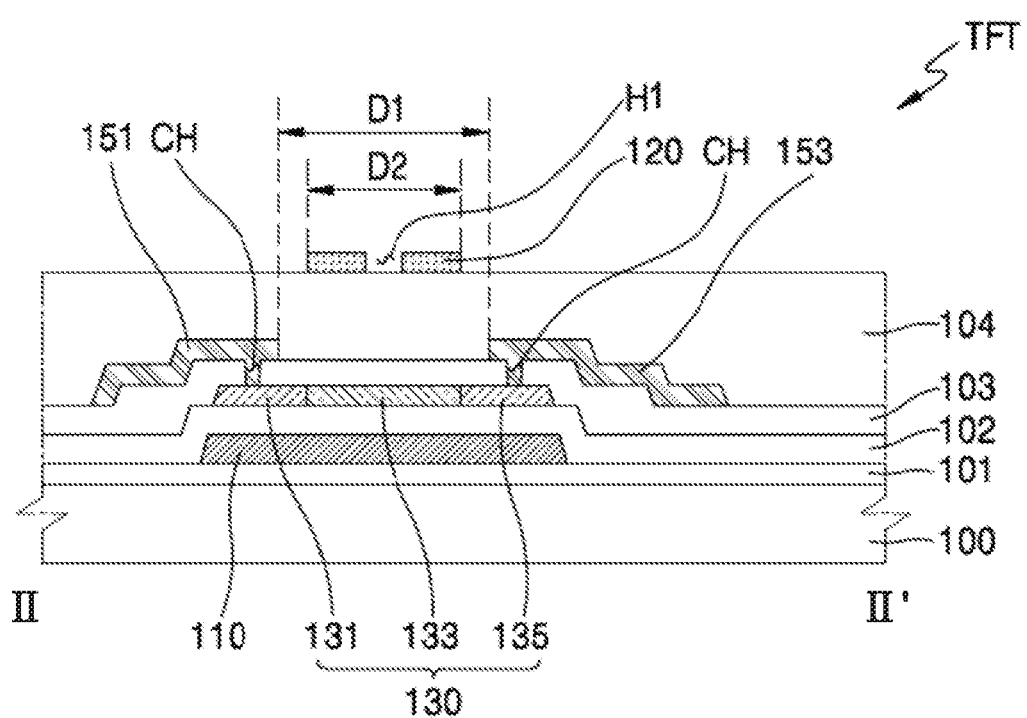
FIG. 2 is a cross-sectional view taken along line II-II' of FIG. 1.

Turning now to FIGS. 1 and 2, FIG. 1 is a schematic plan view of a thin film transistor substrate according to an exemplary embodiment and FIG. 2 is a cross-sectional view taken along line II-II' of FIG. 1. The term "thin film transistor substrate" used herein refers to the substrate 100 on which a thin film transistor is disposed. The "thin film transistor substrate", as illustrated in FIG. 2 may refer to the substrate 100 on which the thin film transistor TFT is disposed, or although not illustrated, may refer to the substrate 100 on which a thin film transistor is disposed, wherein intervening elements or layers and the pixel electrode 170 (see FIG. 7) are disposed on the thin film transistor.

Referring now to FIGS. 1 and 2, the thin film transistor substrate includes a substrate 100, a lower gate electrode 110, a semiconductor layer 130, an upper gate electrode 120, a source electrode 151, and a drain electrode 153.

The substrate 100 may include glass, metal, or plastic such as polyethylene terephthalate (PET), polyethylene naphthalate (PEN), or polyimide. A buffer layer 101 may be further disposed on the substrate 100 to flatten the substrate 100 and prevent impurities from penetrating the display device from the substrate 100. The buffer layer 101 may include a single layer or a plurality of layers, which include silicon nitride and/or silicon oxide.

The semiconductor layer 130 is disposed on the substrate 100. The semiconductor layer 130 includes a channel region 133 interposed between a source region 131 and a drain region 135. The semiconductor layer 130 may include a semiconductor material including amorphous silicon or crystalline silicon or may include an oxide semiconductor.

When the semiconductor layer 130 includes an oxide semiconductor, the semiconductor layer 130 may include at least one element selected from a group including indium (In), gallium (Ga), tin (Sn), zirconium (Zr), vanadium (V), hafnium (Hf) cadmium (Cd), germanium (Ge), and zinc (Zn). For example, the semiconductor layer 130 may include indium gallium zinc oxide (IGZO) and/or indium tin zinc oxide (ITZO). According to another exemplary embodiment, the semiconductor layer 130 may include at least one of materials such as $SnO_2$, $In_2O_3$, ZnO, CdO, $Cd_2SnO_4$, and $TiO_2$.

The lower gate electrode 110 is interposed between the substrate 100 and the semiconductor layer 130, and is overlapped by the semiconductor layer 130. The lower gate electrode 110 not only may serve as a gate electrode, but also prevent light from reaching the semiconductor layer 130 via the substrate 100. For example, when the semiconductor layer 130 includes an oxide semiconductor, the oxide semiconductor may be sensitive to light and cause the semiconductor layer 130 to generate an off current (i.e. a leakage current). As a result, the lower gate electrode 110 can prevent this from happening by serving to block light. In exemplary embodiments, for the above-described reason, the lower gate electrode 110 is made larger than the semiconductor layer 130 and is disposed under the semiconductor layer 130 so that the semiconductor layer 130 overlaps the lower gate electrode.

The lower gate electrode 110 may include a metal material having low resistance and may include a single layer or a multi-layer including at least one metal selected from aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu).

Referring now to FIG. 2 and according to one exemplary embodiment, a first insulating layer 102 may be disposed between the lower gate electrode 110 and the semiconductor layer 130, and a second insulating layer 103 may be disposed on the semiconductor layer 130 and on the first insulating layer 102.

The source electrode 151 and the drain electrode 153 may be disposed on the second insulating layer 103. The source electrode 151 and the drain electrode 153 may be respectively connected to the source region 131 and the drain region 135 of the semiconductor layer 130 via contact holes CH in the second insulating layer 103. The source electrode 151 may be connected to a data line DL and may apply a predetermined signal, and the drain electrode 153 may be electrically connected to a pixel electrode 170.

The source electrode 151 and the drain electrode 153 may each include a single layer or a plurality of layers including at least one metal selected from, for example, aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu).

According to the embodiment of FIG. 2, a third insulating layer 104 may be disposed on the source and drain electrodes 151 and 153, and the upper gate electrode 120 may be disposed on the third insulating layer 104. The upper gate electrode 120 may be disposed on the third insulating layer 104 and may overlap the semiconductor layer 130, wherein the semiconductor layer 130 is interposed between the upper and lower gate electrodes 120 and 110.

The upper gate electrode 120 may include a metallic material having low resistance and may include a single layer or a plurality of layers including at least one metal selected from aluminum (Al), platinum (Pt), palladium (Pd), silver (Ag), magnesium (Mg), gold (Au), nickel (Ni), neodymium (Nd), iridium (Jr), chromium (Cr), lithium (Li), calcium (Ca), molybdenum (Mo), titanium (Ti), tungsten (W), and copper (Cu). Also, the upper gate electrode 120 may include the same metal as or a different metal than the lower gate electrode 110.

Of the double gate electrode structure, the upper gate electrode 120 may be held at a different electric potential than the lower gate electrode 110. This is possible because the upper gate electrode 120 receives signals from a different line than the lower gate electrode, and thus they can be driven independently of each other.

According to an exemplary embodiment, the thin film transistor substrate may further include a gate control line EL and a threshold voltage compensation line CL on the substrate 100, and the lower gate electrode 110 and the upper gate electrode 120 may be respectively connected to the gate control line EL and the threshold voltage compensation line CL. Because the voltage applied to the upper gate electrode 120 and the lower gate electrode 110 are independently controlled, they can be simultaneously held at different potentials.

The thin film transistor substrate having the double gate electrode structure may have a threshold voltage Vth shifted according to a voltage for compensating for the threshold voltage Vth, which is applied to the upper gate electrode 120. For example, when a compensation voltage applied to the upper gate electrode 120 is +1V, the threshold voltage Vth of the thin film transistor substrate having the double gate electrode structure is shifted as much as −1V. When the compensation voltage applied to the upper gate electrode 120 is −2V, the threshold voltage Vth of the thin film transistor substrate having the double gate electrode structure is shifted as much as +2V.

As the thin film transistor substrate according to the present exemplary embodiment has the double gate electrode structure as described above, the threshold voltage Vth of a thin film transistor TFT having the double gate electrode structure is compensated for during an initial image display period for displaying an image. That is, the threshold voltage Vth may be compensated for by changing a compensation voltage with at least one frame period as a unit and supplying the compensation voltage to the upper gate electrode 120 during the initial image display period for displaying an image.

Shapes and sizes of an upper gate electrode and a lower gate electrode of a thin film transistor substrate having the double gate electrode structure as described above have no limitations. However, a parasitic capacitance may be generated between the electrodes having an overlapping area due to a stacked structure of metal layers. The parasitic capacitance may generate a leakage current even when the thin film transistor substrate is turned off and thus may degrade characteristics of a thin film transistor.

The thin film transistor substrate according to the present exemplary embodiment may have at least one of the lower gate electrode 110 and the upper gate electrode 120 including one or more through holes H1 and H2 (i.e. apertures) respectively, thereby reducing an overlapping area between the upper gate electrode 120 and the lower gate electrode 110. As a result, parasitic capacitance generated due to overlap of the upper gate electrode 120 and the lower gate electrode 110 may be decreased, and thus characteristics of the thin film transistor substrate may be improved.

Figure 4:
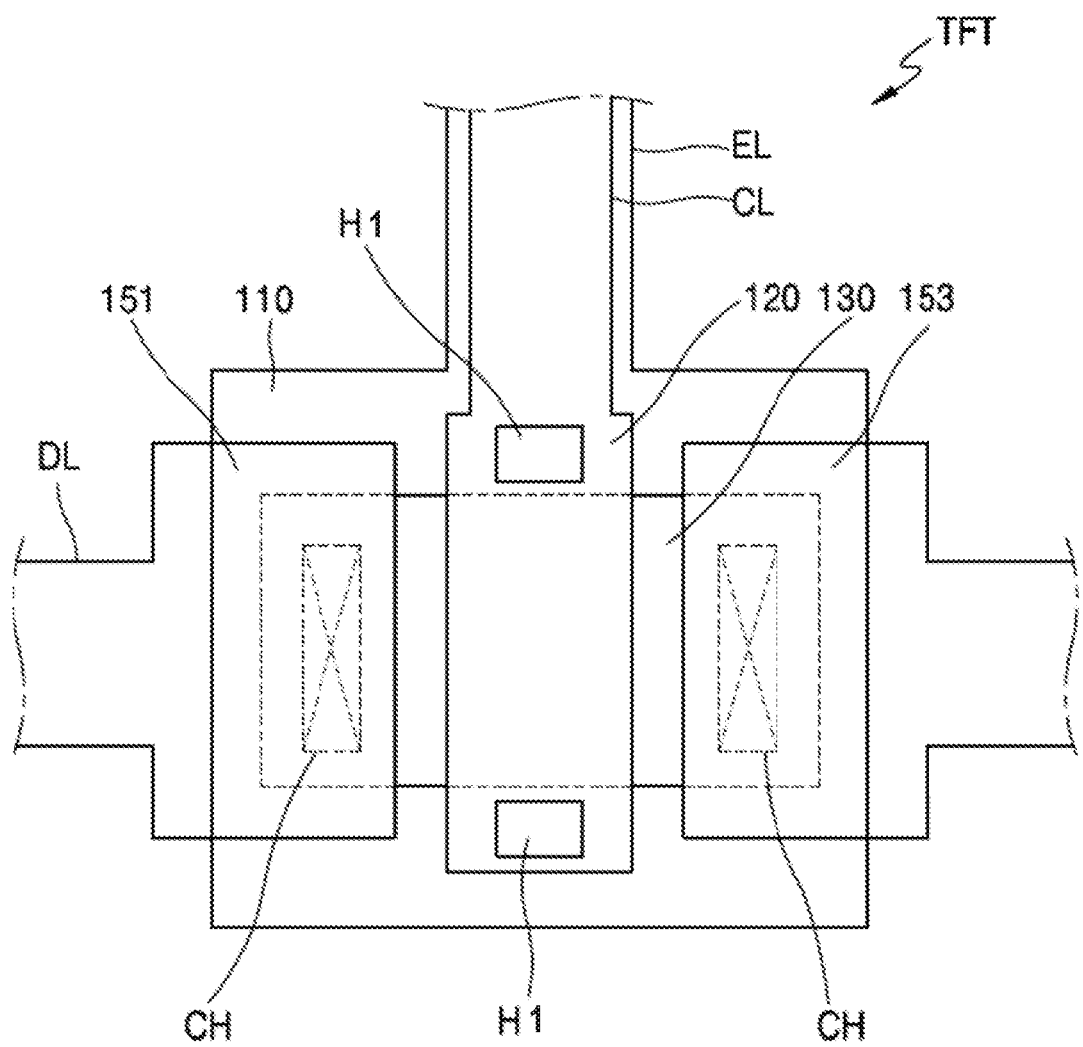
FIG. 4 is a schematic plan view of a thin film transistor substrate according to another exemplary embodiment.
Figure 5:
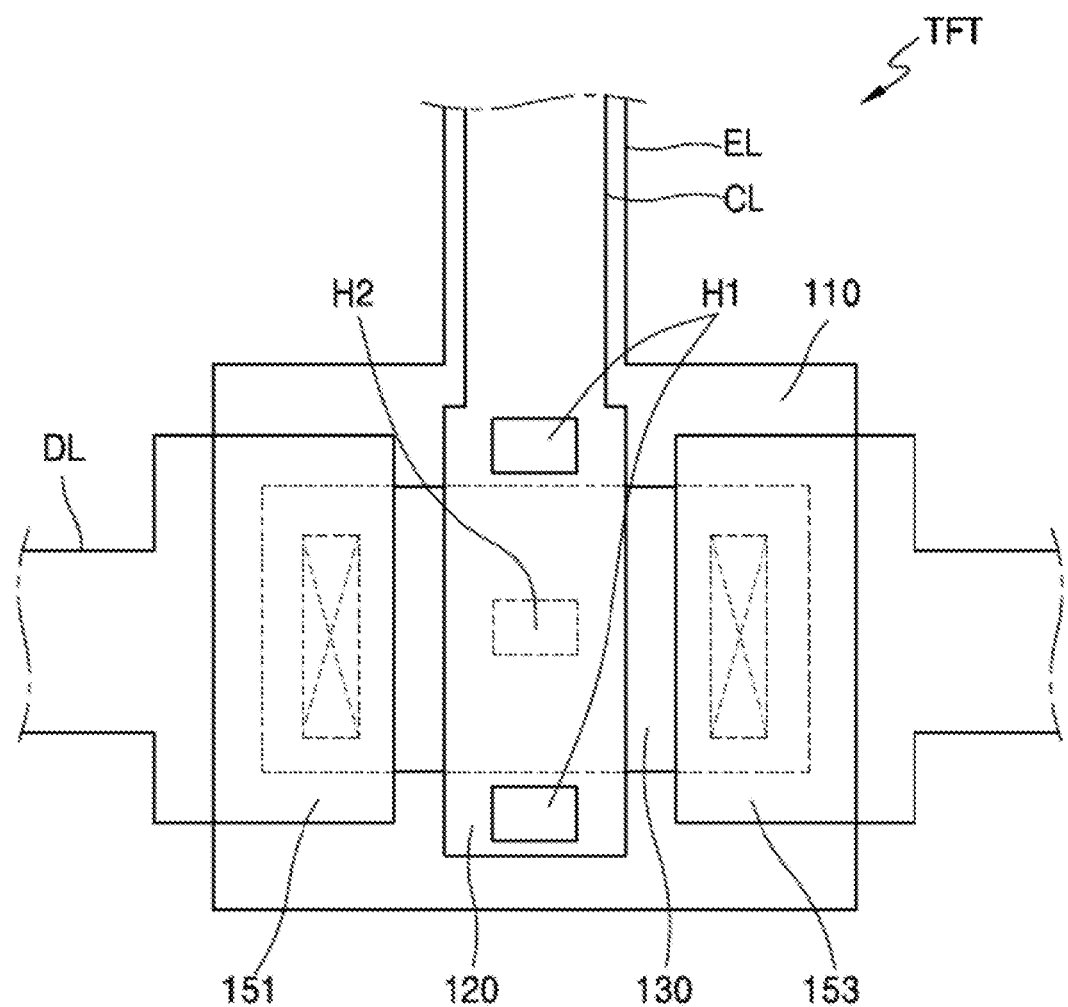
FIG. 5 is a schematic plan view of a thin film transistor substrate according to yet another exemplary embodiment.

Turning now to FIGS. 3A and 3B, FIGS. 3A and 3B are respectively plan views of upper gate electrodes of thin film transistor substrates according to other exemplary embodiments, and FIGS. 4 and 5 are respectively schematic plan views of thin film transistor substrates according to other exemplary embodiments.

Referring now to FIGS. 3A and 3B, a through hole H1 or H2 may be rectangular or circular, and the number of through holes may be two or more. FIG. 3B illustrates an exemplary embodiment in which the upper gate electrode 120 is perforated by three through holes H1. As parasitic capacitance relies on an overlapping area between electrodes, the through holes H1 and H2 may be formed in the upper gate electrode 120 or the lower gate electrode 110 respectively in order to decrease the overlapping area. The through holes H1 and H2 may have any shape or be in any number in order to decrease the overlapping area, and in exemplary embodiments, the through hole has no limitations in the shape and number thereof.

Referring now to FIG. 4, a through hole H1 may be in the upper gate electrode 120. Although the through hole H1 of FIG. 1 overlaps the semiconductor layer 130, the through hole H1 of FIG. 4 does not overlap the semiconductor layer 130. This is because the purpose of the through holes H1 and H2 in the present invention is to decrease a parasitic capacitance between the upper gate electrode 120 and the lower gate electrode 110 by decreasing an area of overlap between the upper gate electrode 120 and the lower gate electrode 110.

Referring now to FIG. 5, through holes may be both in the upper gate electrode 120 and in the lower gate electrode 110. The upper gate electrode 120 may include a first through hole H1, and the lower gate electrode 110 may include a second through hole H2. In this regard, the first through hole H1 and the second through hole H2 may not overlap each other in order to minimize an overlapping area and a parasitic capacitance between the upper gate electrode 120 and the lower gate electrode 110.

The through holes H1 and H2, which are formed in the upper gate electrode 120 and the lower gate electrode 110 respectively in order to decrease an overlapping area, plays a different role from a contact hole that electrically connects electrodes disposed on different layers to each other. Accordingly, an insulating material instead of a metal material may be filled within the through holes H1 and H2. When the second through hole H2 is formed in the lower gate electrode 110, an insulating material filled in the second through hole H2 may be identical to a material of the first insulating layer 102 disposed between the lower gate electrode 110 and the semiconductor layer 130. In addition, when the first through hole H1 is formed in the upper gate electrode 120, an insulating material filled in the first through hole H1 may be identical to a material for the third insulating layer 104 disposed on the upper gate electrode 120.

The through holes H1 and H2 may also serve to reduce parasitic capacitance between the upper and lower gate electrode 120/110 and the source and drain electrodes 151 and 153. As an area of the through hole H1 increases, the parasitic capacitance may decrease. However, the upper gate electrode 120 may be designed so as not overlap the source electrode 151 and the drain electrode 153 in order to effectively eliminate parasitic capacitance between the source electrode 151 and the drain electrode 153.

Referring back to FIGS. 1 and 2, the upper gate electrode 120 is disposed between the source electrode 151 and the drain electrode 153. A width D2 of the upper gate electrode 120 may be less than a distance D1 between the source electrode 151 and the drain electrode 153. As a result, there is essentially no parasitic capacitance and no overlap area between the upper gate electrode and any of the source and drain electrodes 151/153.

For the above-described reason, the upper gate electrode 120 may be smaller than the lower gate electrode 110. For example, the upper gate electrode 120 and the lower gate electrode 110 may both overlap the channel region 133 of the semiconductor layer 130, wherein an area of overlap between the lower gate electrode 110 and the channel region 133 may be greater than an area of overlap between the upper gate electrode 120 and the channel region 133.

Figure 6:
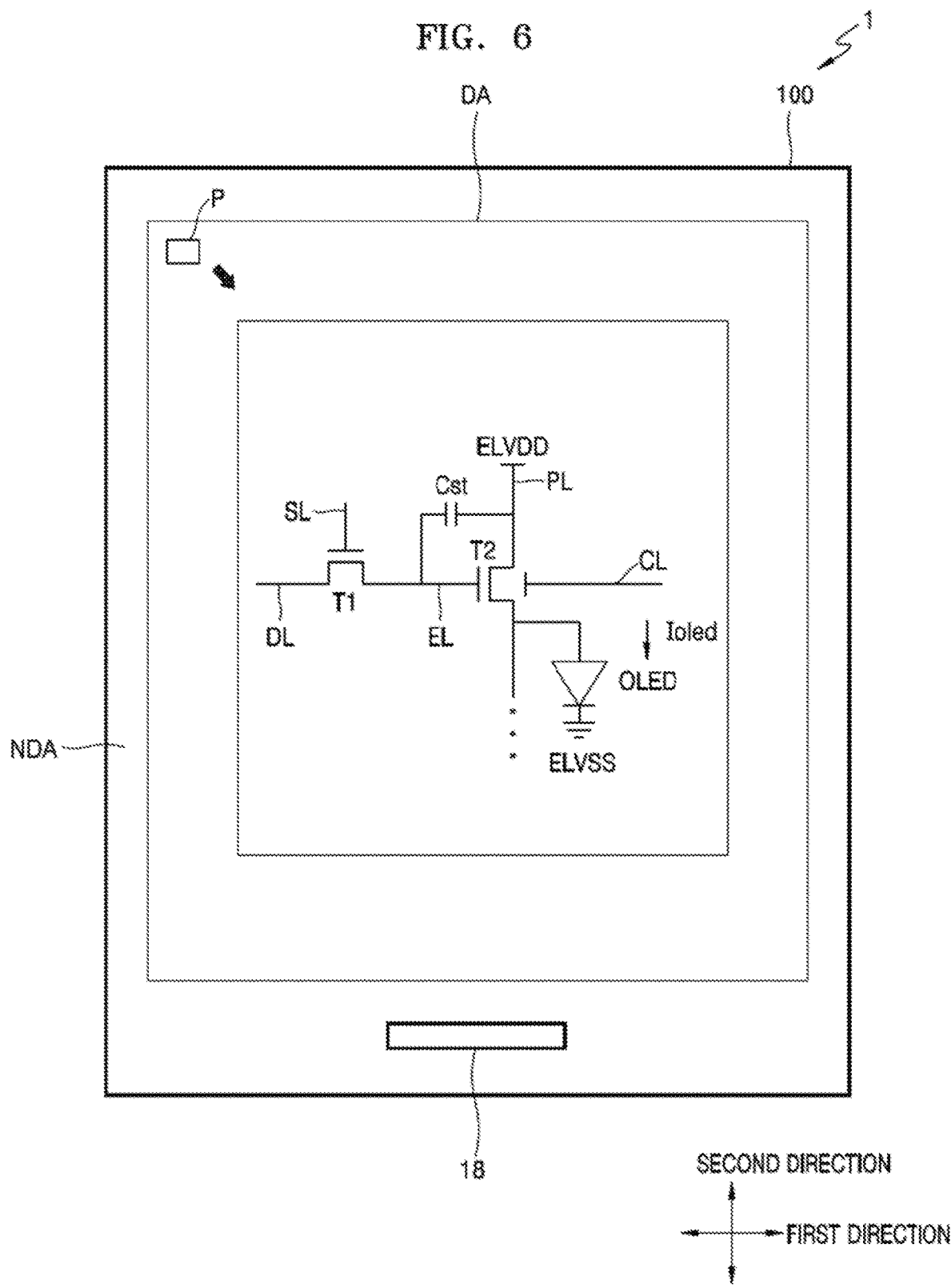
FIG. 6 is a schematic plan view of an organic light-emitting display apparatus according to an exemplary embodiment.
Figure 7:
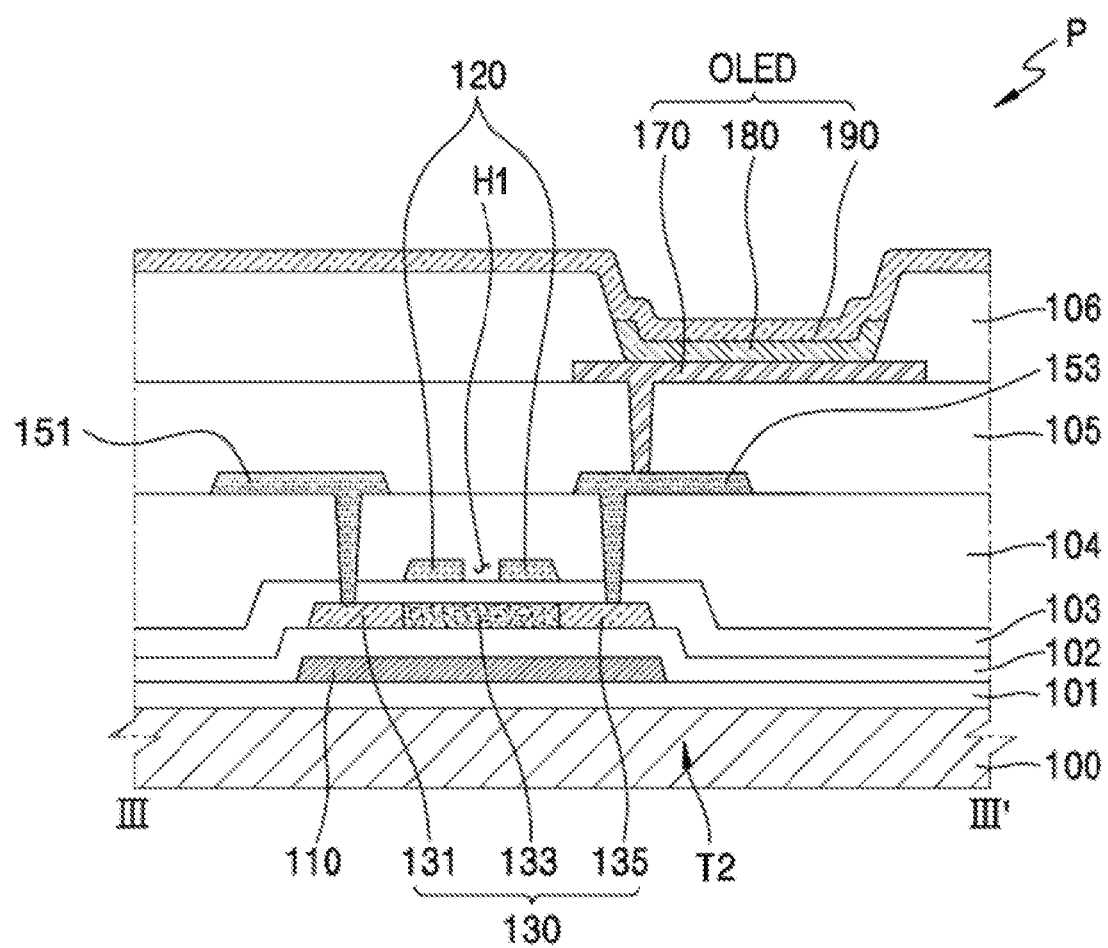
FIG. 7 is a cross-sectional view of a portion of one pixel of the organic light-emitting display apparatus illustrated in FIG. 6.

The structure in which the source electrode 151 and the drain electrode 153 are interposed between the lower gate electrode 110 and the upper gate electrode 120 has been described as an example of a stacked structure of the thin film transistor substrate with reference to FIG. 2. Alternatively, as illustrated in FIGS. 6 and 7 and according to another exemplary embodiment, the thin film transistor substrate may have a source electrode 151 and a drain electrode 153 disposed above (i.e. further from substrate 100 than) the upper gate electrode 120. In this regard, the upper gate electrode 120 may be disposed on a second insulating layer 103, and the source and drain electrodes 151 and 153 may be disposed on a third insulating layer 104. In exemplary embodiments, a stacked structure of the source electrode 151, the drain electrode 153, and the upper gate electrode 120 of the thin film transistor substrate has no limitations.

A fourth insulating layer 105 (see FIG. 7), which is a planarizing layer, may be disposed on the upper gate electrode 120, and a pixel electrode 170 may be disposed on the fourth insulating layer 105. The pixel electrode 170 may be connected to the drain electrode 153 via a Via hole perforating the fourth insulating layer 105.

The pixel electrode 170 may include at least one material selected from a group including indium tin oxide (ITO), indium zinc oxide (IZO), zinc oxide (ZnO), indium oxide ($In_2O_3$), indium gallium oxide (IGO), and aluminum zinc oxide (AZO). Alternatively, the pixel electrode 170 may have a triple structure of transparent conductive oxide layer/semi-transmissive metal layer/transparent conductive oxide layer.

The thin film transistor substrate having the above-described structure, according to the present exemplary embodiments, may include a through hole H1/H2 in the upper gate electrode 120 and/or the lower gate electrode 110, and thus may have a smaller area of overlap between the gate electrodes 120 and 110, thereby resulting in a decreased parasitic capacitance.

Hereinafter, an organic light-emitting display apparatus including a thin film transistor according to one or more exemplary embodiments will be described in conjunction with FIGS. 6 and 7. Turning now to FIGS. 6 and 7, FIG. 6 is a schematic plan view of an organic light-emitting display apparatus 1 according to an exemplary embodiment, and FIG. 7 is a cross-sectional view of a portion of one pixel P of the organic light-emitting display apparatus 1 illustrated in FIG. 6. Unlike the source electrode 151 and the drain electrode 153 of FIG. 2, the source electrode 151 and the drain electrode 153 of FIG. 7 are disposed above the upper gate electrode 120. As described above in the exemplary embodiments, a stacked structure of the thin film transistor substrate has no limitations.

Referring now to FIG. 6, the organic light-emitting display apparatus 1 includes a display area DA and a non-display area NDA on the substrate 100. The display area DA includes a plurality of pixel areas P for displaying an image. Each of the pixel areas P may include a plurality of thin film transistors T1 and T2 and a storage capacitor Cst. Also, the pixel area P may include a display device, for example, an organic light-emitting diode OLED, which receives a driving voltage via the thin film transistors T1 and T2 and the storage capacitor Cst and emits light.

The non-display area NDA is disposed adjacent to the display area DA and may include a pad unit 18. According to an exemplary embodiment as illustrated in FIG. 6, the non-display area NDA may surround the display area DA. According to another exemplary embodiment, the non-display area NDA may instead be disposed adjacent to a side of the display area DA.

According to an exemplary embodiment, the thin film transistors T1 and T2 may include a switching thin film transistor Ti and a driving thin film transistor T2. Although a case where two thin film transistors are included has been described with reference to FIG. 6, exemplary embodiments are not limited thereto, and the type and number of thin film transistors may be modified in other exemplary embodiments.

A gate electrode of the switching thin film transistor T1 may be connected to a scan line SL. One of a source electrode and a drain electrode of the switching thin film transistor T1 may be connected to a data line DL, and the other may be connected to an end of the storage capacitor Cst. When a scan signal is supplied to the switching thin film transistor T1 via the scan line SL, the switching thin film transistor T1 is turned on to supply a data signal from the data line DL to the storage capacitor Cst. In this regard, the storage capacitor Cst may charge voltage corresponding to the data signal.

Referring to FIGS. 6 and 7, the driving thin film transistor T2 has the same structure as the upper gate electrode 120 and/or the lower gate electrode 110 of the thin film transistor substrate described above with reference to FIGS. 1 to 5. The above-described thin film transistor substrate may be applied to any one of a switching thin film transistor and a driving thin film transistor. However, in exemplary embodiments, a case where the above-described thin film transistor substrate is applied to a driving thin film transistor T2 will be mainly described for convenience of description.

The lower gate electrode 110 of the driving thin film transistor T2 may be connected to the gate control line EL which is electrically connected to the switching thin film transistor T1, and the upper gate electrode 120 of the driving thin film transistor T2 may be connected to the threshold voltage compensation line CL. The drain electrode 153 of the driving thin film transistor T2 may be electrically connected to an end of the storage capacitor Cst and a driving voltage line PL, and the source electrode 151 of the driving thin film transistor T2 may be connected to the pixel electrode 170 of the organic light-emitting diode OLED. The drain electrode 153 of the driving thin film transistor T2 is electrically connected to the pixel electrode 170 of the organic light-emitting diode OLED through a via hole Via perforating the fourth insulating layer 105.

The driving thin film transistor T2 is turned on by the switching thin film transistor T1 and may control driving current $I_{oled}$ flowing towards an opposite electrode 190 via the driving voltage line PL in response to a voltage value stored in the storage capacitor Cst. Due to the driving current $I_{oled}$, an emission layer 180 of the organic light-emitting diode OLED may emit light having a predetermined luminance.

Referring now to FIG. 7, the organic light-emitting diode OLED is disposed on the fourth insulating layer 105. The organic light-emitting diode OLED is formed at a location corresponding to the pixel electrode 170 and may include the emission layer 180 and the opposite electrode 190.

The emission layer 180 may include an organic emission layer emitting red, green, blue or white light, and the organic emission layer may include a low-molecular organic material or a high-molecular organic material. When the organic emission layer is a low-molecular organic layer including a low-molecular organic material, the organic emission layer may be disposed in the center of a multi-layered functional layer structure, a hole transport layer (HTL) and a hole injection layer (HIL) may be interposed between the organic emission layer and the pixel electrode 170, and an electron transport layer (ETL) and an electron injection layer (EIL) may be interposed between the opposite electrode 190 and the organic emission layer. One or more layers other than the HIL, HTL, ETL, and EIL may also be additionally stacked if necessary.

The opposite electrode 190 facing the pixel electrode 170 is disposed on the emission layer 180. The opposite electrode 190 may be a transparent electrode or a reflective electrode. When the opposite electrode 190 is a transparent electrode, a metal having a low work function, e.g., Li, Ca, LiF/Ca, LiF/Al, Al, Ag, Mg, or a compound thereof, may be thinly deposited to face the organic emission layer, and an auxiliary electrode layer or a bus electrode line may be formed thereon using transparent conductive oxide such as ITO, IZO, ZnO, or $In_2O_3$. When the opposite electrode 190 is a reflective electrode, Li, Ca, LiF/Ca, LiF/Al, Al, Ag, Mg, or a compound thereof may be deposited on the whole area. However, exemplary embodiments are not limited thereto, and alternatively, an organic material such as a conductive polymer may be used to form the pixel electrode 170 and the opposite electrode 190.

As described above, the organic light-emitting display apparatus 1 according to one or more exemplary embodiments include a thin film transistor having a double gate structure to control the threshold voltage, and may include at least one aperture in the upper gate electrode 120 and/or the lower gate electrode 110 to decrease an area of overlap between the lower gate electrode 110 and the upper gate electrode 120, thereby reducing parasitic capacitance between the lower gate electrode 110 and the upper gate electrode 120. Accordingly, leakage current of the thin film transistor may be decreased, and thus, characteristics of the thin film transistor may be improved, and degradation in picture quality of the organic light-emitting display apparatus may be prevented.

Furthermore, the inventors have found that by decreasing the area of overlap between the upper gate electrode 120 and the lower gate electrode 110 by including a through hole or aperture in one of the upper gate electrode 120 and lower gate electrode 110 as opposed to narrowing the width of one of the upper gate electrode 120 and lower gate electrode 110, it is possible to more easily control the compensation of the threshold voltage. This is because the electric potential applied to the lower gate electrode 110 is different from that applied to the upper gate electrode 120 by being independently controlled, and since the width of the upper gate electrode 120 and lower gate electrode 110 have not decreased due to the aperture formed therein, each of the upper gate electrode 120 and lower gate electrode 110 may overlap a larger portion and a larger width of the semiconductor layer 130 than would be the case if the width of the upper gate electrode 120 and/or lower gate electrode 110 were to be reduced. The Inventors have found that this allows for easier control of the compensation of the threshold voltage.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising a plurality of pixels over a substrate, wherein each of the pixels comprises:
    a switching thin film transistor arranged over the substrate;
    a gate control line arranged over the substrate;
    a driving thin film transistor arranged over the substrate and electrically connected to the switching thin film transistor through the gate control line;
    a pixel electrode connected to the driving thin film transistor;
    an emission layer arranged over the pixel electrode; and
    an opposite electrode facing the pixel electrode, the emission layer being interposed between the pixel electrode and the opposite electrode,
    wherein:
    the driving thin film transistor comprises:
        a lower gate electrode arranged over the substrate;
        a semiconductor layer arranged over the substrate and overlapping the lower gate electrode, the semiconductor layer including a channel region interposed between a source region and a drain region; and
        an upper gate electrode arranged over the semiconductor layer and overlapping the semiconductor layer and the lower gate electrode;
    the source region and the drain region are arranged along a first direction, and the upper gate electrode is perforated by at least three apertures arranged along a second direction intersecting the first direction; and
    the lower gate electrode has a larger area, when viewed from a top side, than the upper gate electrode and the semiconductor layer.

2. The organic light-emitting display apparatus of claim 1, wherein the aperture is not arranged at a location that corresponds to the semiconductor layer.

3. The organic light-emitting display apparatus of claim 1, wherein the aperture is filled with an insulating material.

4. The organic light-emitting display apparatus of claim 1, wherein a potential of the lower gate electrode differs from that of the upper gate electrode by being independently controlled.

5. The organic light-emitting display apparatus of claim 4, further comprising
    a threshold voltage compensation line arranged over the substrate and connected to the upper gate electrode.

6. The organic light-emitting display apparatus of claim 1, wherein:
    the lower gate electrode is perforated by a second aperture; and
    the first aperture and the second aperture do not overlap each other.

7. The organic light-emitting display apparatus of claim 1, the semiconductor layer being comprised of an oxide material having an element selected from a group including indium (In), gallium (Ga), tin (Sn), zirconium (Zr), vanadium (V), hafnium (Hf) cadmium (Cd), germanium (Ge), and zinc (Zn), the lower gate electrode prevents light transmitted through the substrate from reaching the semiconductor layer.

* * * * *